(12) United States Patent
Teramura et al.

(10) Patent No.: US 9,608,140 B2
(45) Date of Patent: Mar. 28, 2017

(54) SOLAR CELL AND SOLAR CELL MODULE

(71) Applicant: KYOCERA CORPORATION, Kyoto (JP)

(72) Inventors: Tsuyoshi Teramura, Moriyama (JP);
Takemichi Honma, Hikone (JP);
Norikazu Ito, Moriyama (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 15/033,073

(22) PCT Filed: Oct. 30, 2014

(86) PCT No.: PCT/JP2014/078910
§ 371 (c)(1),
(2) Date: Apr. 28, 2016

(87) PCT Pub. No.: WO2015/064696
PCT Pub. Date: May 7, 2015

(65) Prior Publication Data
US 2016/0284893 A1 Sep. 29, 2016

(30) Foreign Application Priority Data

Oct. 30, 2013 (JP) .................................. 2013-225368
Nov. 28, 2013 (JP) .................................. 2013-245961

(51) Int. Cl.
*H01L 31/0224* (2006.01)
*H01L 31/02* (2006.01)
(Continued)

(52) U.S. Cl.
CPC .. *H01L 31/022433* (2013.01); *H01L 31/0201* (2013.01); *H01L 31/0465* (2014.12); *H01L 31/0504* (2013.01); *Y02E 10/50* (2013.01)

(58) Field of Classification Search
CPC ......... H01L 31/022433; H01L 31/0201; H01L 31/0224; H01L 31/022425;
(Continued)

(56) References Cited

U.S. PATENT DOCUMENTS 8,866,002 B1* 10/2014 Pycroft ............... H01L 31/0201
136/252
9,006,559 B2 4/2015 Kobamoto et al.
2012/0017965 A1* 1/2012 Kabade ............... H01L 31/0201
136/244

FOREIGN PATENT DOCUMENTS

JP 2000-133826 5/2000
JP 2006-278695 10/2006
(Continued)

OTHER PUBLICATIONS

International Search Report in International Patent Application No. PCT/JP2014/078910, dated Jan. 13, 2015, in 2 pages.
(Continued)

*Primary Examiner* — Susan D Leong
(74) *Attorney, Agent, or Firm* — Duane Morris LLP

(57) ABSTRACT

To improve the yield of a solar cell in its production process, a solar cell includes a semiconductor substrate including a first main surface and a second main surface corresponding to the backside of the first main surface, a busbar electrode on a line extending in a first direction on the second main surface, and end-portion electrodes each being an extension of the busbar electrode on the second main surface and separated from the busbar electrode, and each of the end-portion electrodes having a larger thickness than that of the busbar electrode.

12 Claims, 15 Drawing Sheets

(51) Int. Cl.
*H01L 31/05* (2014.01)
*H01L 31/0465* (2014.01)

(58) Field of Classification Search
CPC ........... H01L 31/022441; H01L 31/042; H01L 31/05; H01L 31/046; H01L 31/0504; H01L 31/0508; H01L 31/0516
See application file for complete search history.

(56) References Cited

FOREIGN PATENT DOCUMENTS

| WO | WO 2012/173203 | 12/2012 |
| WO | WO 2013/039158 A1 | 3/2013 |
| WO | WO 2013/140552 A1 | 9/2013 |

OTHER PUBLICATIONS

Written Opinion of the International Searching Authority in International Patent Application No. PCT/JP2014/078910, dated Jan. 13, 2015, and Statement of Relevance of Non-English References Cited Therein, in 5 pages.

\* cited by examiner

SOLAR CELL AND SOLAR CELL MODULE

TECHNICAL FIELD

The present invention relates to a solar cell and a solar cell module.

BACKGROUND ART

Solar cell modules for use in solar photovoltaic power generation and so forth each include a plurality of crystalline solar cells electrically connected together, the plurality of crystalline solar cells including, for example, silicon substrates.

In such a solar cell module, strip conductive leads (connection tabs) composed of a metal are soldered to first electrodes of solar cells and electrodes on backsides of adjacent solar cells to connect the plural solar cells together (for example, see Japanese Unexamined Patent Application Publication No. 2006-278695).

SUMMARY OF INVENTION

Technical Problem

In the connection of the solar cells with the conductive lead, the first electrode of one of the solar cells is connected to the electrode on the backside of a corresponding one of the adjacent solar cells, so that the conductive lead extends from the upper side to the one solar cell to the lower side of the corresponding solar cell.

Thus, for example, in a production process of the solar cell module, when a pressure is vertically applied to the solar cells, cracking, chipping, or the like occurs at end portions of the solar cells in contact with the conductive lead to reduce, for example, the yield of the solar cell module, in some cases.

It is an object of the present invention to provide a solar cell that improves, for example, the yield of a solar cell module in its production process.

Solution to Problem

A solar cell according to an embodiment of the present invention includes a semiconductor substrate including a first main surface and a second main surface corresponding to the backside of the first main surface; a busbar electrode on a line extending in a first direction on the second main surface, the busbar electrode being arranged between portions of the second main surface in the vicinities of both end portions of the second main surface in the first direction; and pads in the portions of the second main surface in the vicinities of the end portions of the second main surface in the first direction, each of the pads being an extension of the busbar electrode and separated from the busbar electrode, and each of the pads having a larger thickness than that of the busbar electrode.

A solar cell module according to an embodiment of the present invention includes a plurality of the solar cells described above, in which the plurality of the solar cells are arranged, and adjacent solar cells are electrically connected together through a strip conductive lead in contact with the pad.

Advantageous Effects of Invention

In the solar cell and the solar cell module with the foregoing structures, for example, the yield of the solar cell module in its production process is improved.

DESCRIPTION OF EMBODIMENTS

Figure 1:
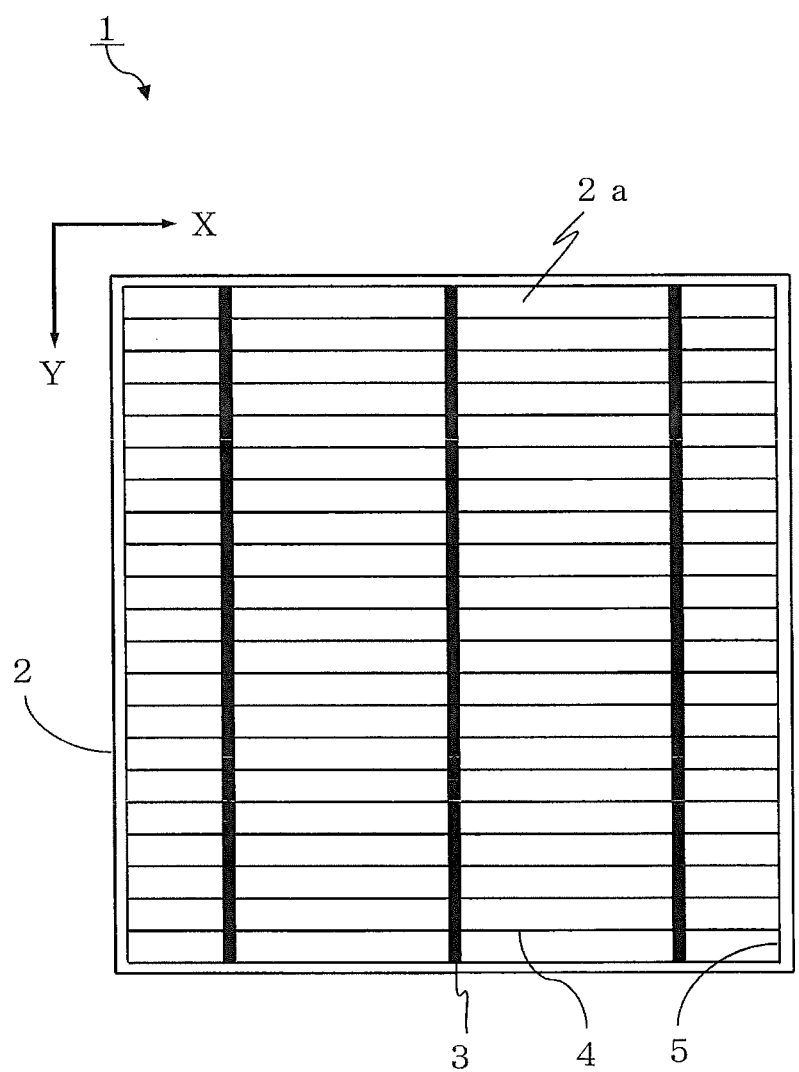
FIG. 1 is a schematic plan view of a solar cell according to an embodiment of the present invention when viewed from the side of a first main surface.

A solar cell and a solar cell module according to an embodiment of the present invention will be described below with reference to the drawings. Members which are included in the solar cell and the solar cell module and which have the same name are designated using the same reference numerals. The drawings are schematically illustrated. Thus, in each of the drawings, the size, the positional relationship, and so forth of constituent elements may be appropriately changed.

<Solar Cell>

Figure 2:
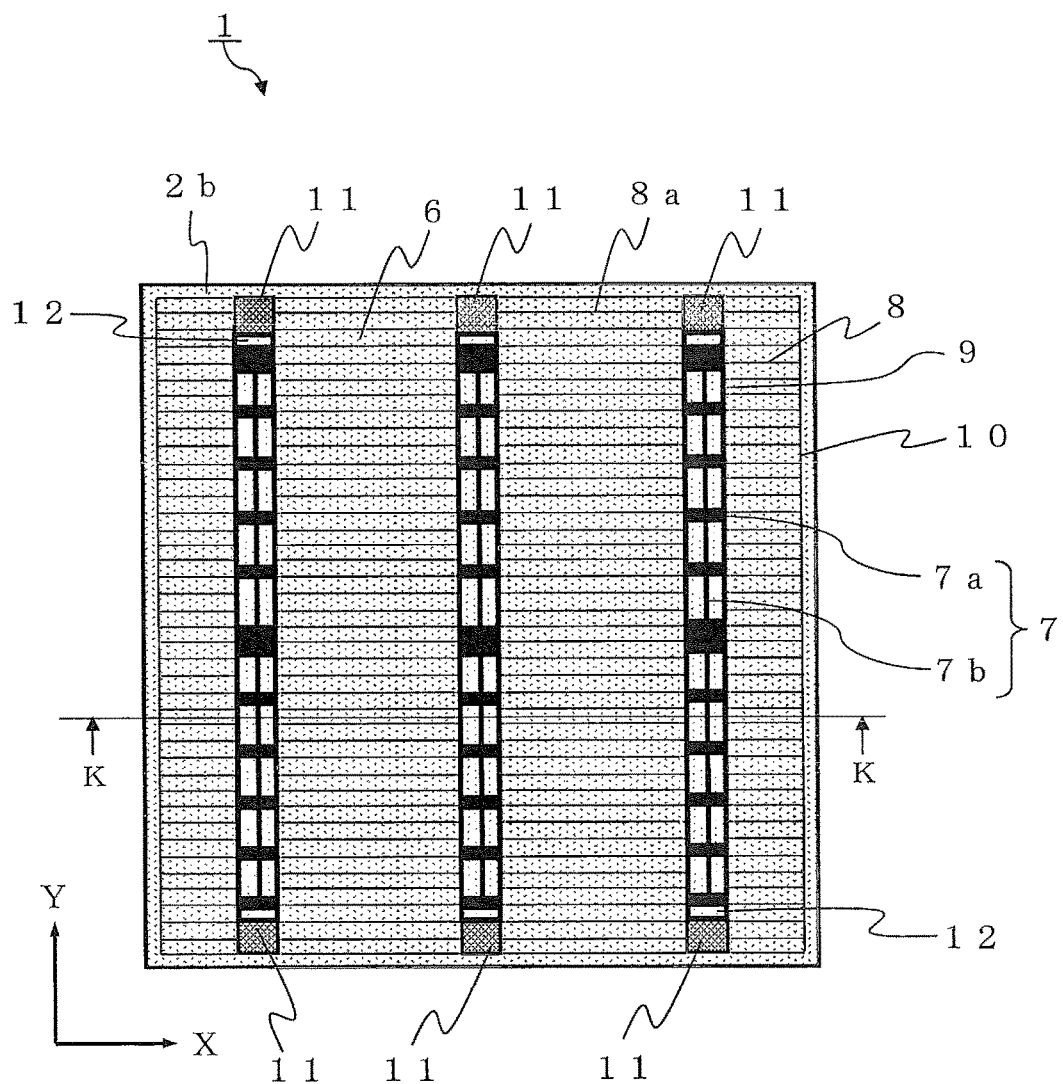
FIG. 2 is a schematic plan view of a solar cell according to an embodiment of the present invention when viewed from the side of a second main surface.
Figure 3:
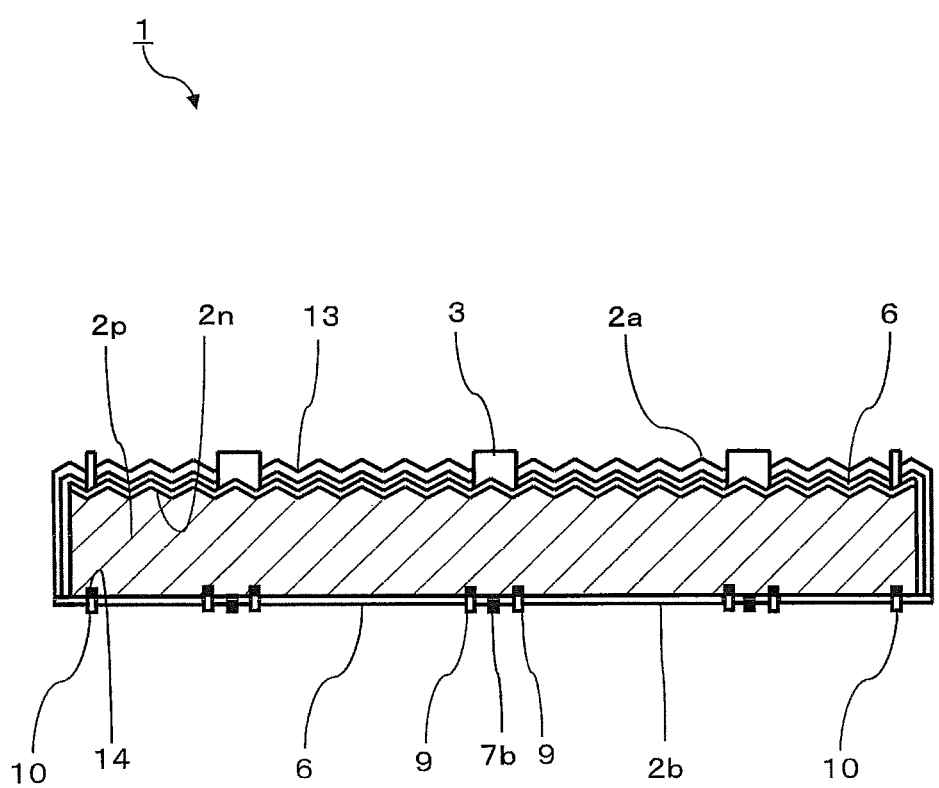
FIG. 3 illustrates the schematic structure of a solar cell of an embodiment of the present invention and is a cross-sectional view taken along line K-K in FIG. 2.

As illustrated in FIGS. 1 to 3, a solar cell 1 includes a semiconductor substrate 2. The semiconductor substrate 2 includes a first main surface 2a serving as a main surface on which light is mainly incident; and a second main surface 2b corresponding to the backside of the first main surface 2a.

The semiconductor substrate 2 includes a first semiconductor portion 2p having a first conductivity type (for example, p-type) and a second semiconductor portion 2n arranged on the first semiconductor portion 2p, the second semiconductor portion 2n having a second conductivity type (for example, n-type) opposite to the conductivity type of the first semiconductor portion 2p. A single-crystal or polycrystalline silicon substrate which contains a predetermined dopant element, for example, boron or gallium, and which has one conductivity type (for example, p-type) is used for the semiconductor substrate 2. The semiconductor substrate 2 may have a thickness of, for example, about 100 to about 250 μm. The shape of the semiconductor substrate is not particularly limited and may be a quadrangle, for example, a square or rectangle, with a side having a length of about 140 to about 180 mm.

The second semiconductor portion 2n is a layer having a conductivity type opposite to that of the first semiconductor portion 2p and is arranged on the side of the first main surface 2a of the semiconductor substrate 2. When the first semiconductor portion 2p has p-type conductivity, the second semiconductor portion 2n is formed so as to have n-type conductivity. When the second semiconductor portion 2n having n-type conductivity is formed, the second semiconductor portion 2n may be formed by diffusion of a dopant element, such as phosphorus, into a portion of the semiconductor substrate 2 adjacent to the first main surface 2a.

A passivation film 6 is arranged on an at least substantially entire area of the semiconductor substrate 2 on the side of the second main surface 2b, which is preferred to improve the photoelectric conversion efficiency of the solar cell 1. The passivation film 6 has the effect of reducing the recombination of minority carriers on the side of the second main surface 2b of the semiconductor substrate 2. As the passivation film 6, silicon nitride, silicon oxide, titanium oxide, aluminum oxide, or the like may be used. The passivation film 6 has a thickness of about 10 to about 200 nm and may be formed by, for example, an atomic layer deposition (ALD) method, a PECVD method, a thermal CVD method, an evaporation method, or a sputtering method. The passivation film 6 may be arranged on the first main surface 2a and a side surface of the semiconductor substrate 2.

An antireflection film 13 is arranged on the first main surface 2a of the semiconductor substrate 2. The antireflection film 13 reduces the light reflectance of the first main surface 2a to increase the amount of light absorbed by the semiconductor substrate 2. The antireflection film 13 functions to increase electron-hole pairs generated by light absorption and thus contributes to improve the conversion efficiency of the solar cell 1. The antireflection film 13 is formed of, for example, a silicon nitride film, a titanium oxide film, a silicon oxide film, an aluminum oxide film, or a laminated film thereof. The thickness and so forth of the antireflection film 13 may be appropriately optimized, depending on its constituent material. For example, the antireflection film 13 preferably has a refractive index of about 1.8 to about 2.3 and a thickness of about 30 to about 120 nm.

As illustrated in FIG. 1, a first electrode on the side of a light-receiving surface is arranged on the second semiconductor portion 2n. The first electrode includes connection electrodes 3 and collector electrodes 4. One or both end portions of each of the collector electrodes 4 are connected to the corresponding connection electrodes 3. An auxiliary collector electrode 5 may be arranged so as to connect outer end portions of the collector electrodes 4 located at both ends of the solar cell 1.

The connection electrodes 3 are to be connected to a conductive lead in a module production process described below and has a strip shape. For example, about 2 to about 5 connection electrodes 3 are arranged in a first direction (Y direction in FIG. 1). Each of the connection electrodes 3 has a width of about 1 to about 3 mm. The collector electrodes 4 and the auxiliary collector electrode 5 collect photogenerated carriers. Each of the collector electrodes 4 has a line width of about 30 to about 200 μm. The plural collector electrodes 4 are arranged at intervals of about 1 to about 3 mm in the X direction in FIG. 1 and are substantially orthogonal to the connection electrodes 3. The auxiliary collector electrode 5 may have a line width of about 30 to about 200 μm.

The connection electrodes 3, the collector electrodes 4, and the auxiliary collector electrode 5 each have a thickness of about 10 to about 40 μm and contain a metal containing silver (or copper or a silver-copper alloy) as a main component. These electrodes may be formed by, for example, the application of an electrode conductive paste composed of the metal, a glass frit, an organic vehicle, and so forth using a screen printing method or the like to form a desired form, and then firing.

As illustrated in FIG. 2, a second electrode includes busbar electrodes 7, transverse finger electrodes 8, auxiliary busbar electrodes 9, longitudinal finger electrodes 10, and end-portion electrodes 11 serving as pads composed of a conductive material and is arranged on the passivation film 6.

For example, about 2 to about 5 busbar electrodes 7 are arranged on lines extending in the first direction (Y direction in FIG. 2) on the second main surface so as to be opposite to the connection electrodes 3. The busbar electrodes 7 are arranged on the lines extending in the first direction on the second main surface 2b, the busbar electrodes 7 being arranged between portions of the second main surface 2b in the vicinities of both end portions in the first direction. That is, the busbar electrodes 7 are arranged between the portions in the vicinities of both end portions of the semiconductor substrate 2. The end-portion electrodes 11 are arranged in the portions of the second main surface 2b in the vicinities of the end portions in the first direction, the end-portion electrodes 11 being extensions of the busbar electrodes 7 and separated from the busbar electrodes 7. Each of the busbar electrodes 7 may have a continuous or discontinuous strip shape. As illustrated in FIG. 2, each of the busbar electrodes 7 may include island portions 7a and a linear portion 7b. Each of the busbar electrodes 7 may have a shape consisting of the island portions 7a.

When each of the busbar electrodes 7 include the island portions 7a and the linear portion 7b, about 5 to about 20 island portions 7a are spaced apart from each other and protrude from the linear portion 7b in the second direction (X direction). The island portions 7a are to be connected to a strip conductive lead in a module production process described below. Thus, the island portions 7a are connected together with the linear portion 7b. Accordingly, even if any one of the island portions 7a is insufficiently connected to the conductive lead, an increase in the resistance component of a solar cell module is inhibited.

When each of the busbar electrodes 7 includes the island portions 7a and the linear portion 7b, each of the island portions 7a may have a size of about 3 to about 10 mm in the width direction (X direction) and about 1 to about 5 mm in the longitudinal direction (Y direction). The linear portion 7b has a size of about 1 to about 3 mm in the width direction (X direction). Each of the busbar electrodes 7 (the island portions 7a and the linear portion 7b) has a thickness of about 2 to about 15 µm. The busbar electrodes 7 may be formed by the application of an electrode conductive paste composed of silver (or copper or a silver-copper alloy) as a main component, a glass frit, an organic vehicle, and so forth using a screen printing or the like to form a desired form, and the firing.

The end-portion electrodes 11 are extensions of the busbar electrodes 7 and spaced apart from the busbar electrodes 7 on both end-portion sides of the busbar electrodes 7 with gap portions 12. The end-portion electrodes 11 are formed so as to be thicker than the busbar electrodes 7. That is, when each of the busbar electrodes 7 has a thickness of about 2 to about 15 µm as described above, each of the end-portion electrodes 11 is formed so as to have a thickness of about 20 to about 60 µm. When the busbar electrodes 7 and the end-portion electrodes 11 are formed by a screen printing method, the viscosity of the paste used for the production of the end-portion electrodes 11 may be higher than that of the paste used for the production of the busbar electrodes 7. An emulsion coating of a screen mask used for the production of the end-portion electrodes 11 may have a larger thickness than that for the production of the busbar electrodes 7. The mesh openings of the screen mask used for the production of the end-portion electrodes 11 may be larger than that for the production of the busbar electrodes 7.

Figure 4:
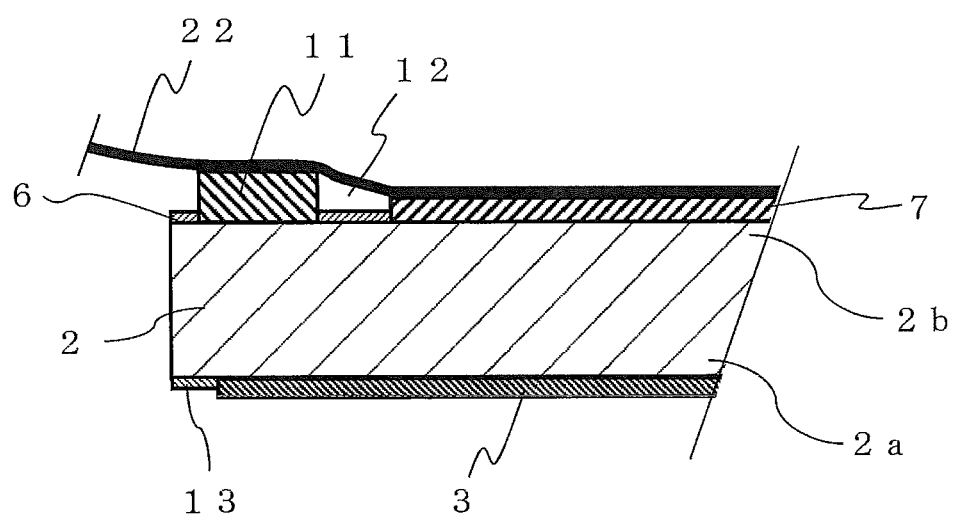
FIG. 4 is a cross-sectional view schematically illustrating a state of an end portion of a solar cell according to the embodiment when a conductive lead is connected to the solar cell.

In this structure, as illustrated in FIG. 4, the end-portion electrodes 11 are thicker than the busbar electrodes 7. Thus, conductive leads 22 connected to the busbar electrodes 7 are arranged so as to extend obliquely upward from the end portions of the busbar electrodes 7 and so as to be placed on top faces of the end-portion electrodes 11. Even if a pressure is vertically applied to the solar cell 1 in the production process of a solar cell module, the pressure is received by the top faces of the end-portion electrodes 11. None of the end portions of the semiconductor substrate 2 come into contact with the conductive leads 22. This inhibits, for example, cracking or chipping starting from the end portions of the semiconductor substrate 2.

As illustrated in FIG. 2, the end-portion electrodes 11 are discontinuously arranged on the extensions of the busbar electrodes 7 in the second direction (X direction). This reduces the area of the passivation film 6 damaged by the end-portion electrodes 11 (in other words, a metal, such as aluminum, contained in the end-portion electrodes 11 diffuses into a portion of the passivation film 6 during, for example, firing for the formation of the end-portion electrodes 11. The portion of the passivation film 6 is degraded and does not function as a passivation film), thereby further improving the photoelectric conversion efficiency of the solar cell.

The busbar electrodes 7 are composed of a material that can be soldered with solder. Preferably, the end-portion electrodes 11 are composed of a material which has lower wettability with solder than that of the busbar electrodes 7 and which cannot be soldered. The busbar electrodes 7 are composed of the material that can be soldered; hence, in a production process of a solar cell module, the conductive leads 22 can be directly soldered to the busbar electrodes 7. This makes it possible to easily form a low-resistance connection. Furthermore, the end-portion electrodes 11 are not easily soldered or are not soldered to the conductive leads 22, thus inhibiting the generation of thermal stress due to a difference in thermal expansion coefficient between the end-portion electrodes 11 and the conductive leads 22. In this case, the end-portion electrodes 11 are less likely to peel off. The bonding strength between the end-portion electrodes 11 and the semiconductor substrate 2 is not reduced. Thereby, a solar cell having higher durability is provided. The term "solder" used here indicates solder used for the connection between the busbar electrodes 7 and the conductive leads 22. Examples of the solder include solders mainly composed of tin (Sn) and lead (Pb), for example, a eutectic solder containing 60% to 63% by mass of tin and the balance being substantially lead. Furthermore, substantially lead-free solders may also be used, for example, a solder containing 90% to 97% by mass of tin and the balance being silver (Ag), copper (Cu), or the like, and a solder containing tin as a main component and zinc (Zn), bismuth (Bi), or indium (In).

Preferably, the busbar electrodes 7 mainly contain silver. Preferably, the end-portion electrodes 11 mainly contain aluminum. The busbar electrodes 7 mainly contain silver, thus inhibiting oxidation during firing. This results in a good soldered state between the busbar electrodes 7 and the conductive leads 22. The end-portion electrodes 11 mainly contain aluminum. Thus, the end-portion electrodes 11 are not soldered. In addition, aluminum diffuses, in a high concentration, in portions of the semiconductor substrate 2 where the end-portion electrodes 11 are arranged. The aluminum acts as a p-type impurity to form a back surface field (BSF) layer to improve the photoelectric conversion efficiency of the solar cell.

In the case where the busbar electrodes 7 mainly contain silver and where the end-portion electrodes 11 mainly contain aluminum as described above, when both are in contact with each other or stacked together without arranging the gap portions 12, alloy layers of silver and aluminum are formed there by firing. The alloy layers have a high thermal shrinkage ratio. Cooling after the firing can cause the generation of tensile stresses between the formed alloy layers and the semiconductor substrate 2, thereby leading to cracking or breaking starting from the alloy layers. In contrast, in the solar cell 1 according to the embodiment as illustrated in FIG. 4, the busbar electrodes 7 are separated from the end-portion electrodes 11 with the gap portions 12 provided therebetween. The presence of the gap portions 12 eliminates the contact or stacking of both the electrodes. Thus, none of the alloy layers of silver and aluminum are formed. Hence, it is possible to inhibit a reduction in strength there.

Figure 5:
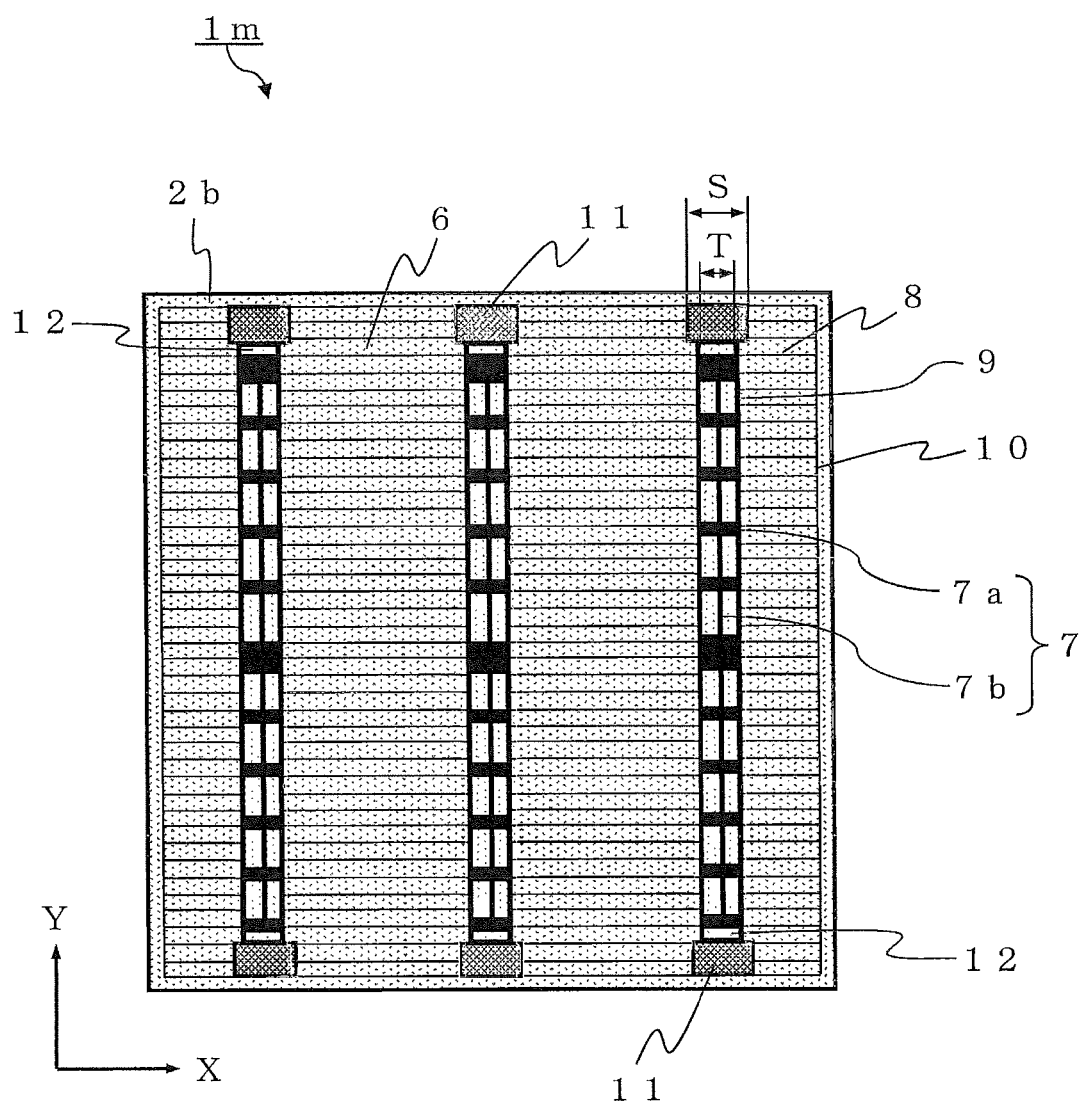
FIG. 5 is a schematic plan view of a solar cell according to another embodiment of the present invention when viewed from the side of a second main surface.

Like a solar cell 1m according to another embodiment illustrated in FIG. 5, the width, S, of the end-portion electrodes 11 is preferably larger than the width, T, of portions (that is, the island portions 7a) of the busbar electrodes to which the conductive leads 22 are connected. For this configuration, in connecting the conductive leads 22 to the busbar electrodes 7, even if the conductive leads 22 are not in parallel to the busbar electrodes 7 and are obliquely connected to the busbar electrodes 7, it is possible to inhibit the contact of the conductive leads 22 with the end portions of the semiconductor substrate 2.

The transverse finger electrodes 8 and the longitudinal finger electrodes 10 both serve to collect photogenerated carriers. The transverse finger electrodes 8 are arranged so as to extend in the second direction (X direction) orthogonal to the first direction (Y direction) and have a line width of about 100 to about 500 µm and a thickness of about 15 to about 40 µm. The plural transverse finger electrodes 8 are arranged so as to be spaced apart from each other at intervals of about 1 to about 6 mm. One or both end portions of each of the transverse finger electrodes 8 are connected to the corresponding auxiliary busbar electrodes 9. The longitudinal finger electrodes 10 are arranged so as to connect outer end portions of the transverse finger electrodes 8 together on both sides of the solar cell 1. The longitudinal finger electrodes 10 have a line width of about 100 to about 300 µm and a thickness of about 15 to about 40 µm. The longitudinal finger electrodes 10 are arranged in the first direction (Y direction). The transverse finger electrodes 8 and the longitudinal finger electrodes 10 are composed of aluminum as a main component and may be formed by the application of an electrode conductive paste composed of a glass frit, an organic vehicle, and so forth using a screen printing method or the like to form a desired form, and then firing. As described above, the transverse finger electrodes 8, the longitudinal finger electrodes 10, and the end-portion electrodes 11 are composed of the same material. Thus, they may be simultaneously formed by the screen printing method or the like, leading to the simplification of the process.

Each of the auxiliary busbar electrodes 9 is arranged on each side of a corresponding one of the busbar electrodes 7 so as to extend in the first direction (Y direction) along the busbar electrodes 7, and has a strip shape, a line width of about 0.5 to about 3 mm, and a thickness of about 30 to about 60 µm. The auxiliary busbar electrodes 9 serve to connect the transverse finger electrodes 8 together. The auxiliary busbar electrodes 9 are stacked on both end regions of the island portions 7a of the busbar electrodes 7 in the width direction and connected to the busbar electrodes 7. The auxiliary busbar electrodes 9 serve to further collect photogenerated carriers collected by the transverse finger electrodes 8 and the longitudinal finger electrodes 10 and transfer them to the busbar electrodes 7. The arrangement of the auxiliary busbar electrodes 9 enables the transfer of photogenerated carriers to the island portions 7a of the busbar electrodes 7 without waste. Furthermore, this eliminates the need to form the busbar electrodes 7 into strips to reduce the amount of silver used, thereby reducing the cost of the solar cell 1.

The auxiliary busbar electrodes 9 are composed of the same material as the transverse finger electrodes 8, thus leading to the simplification of the process. Specifically, the auxiliary busbar electrodes 9 may be formed by the application of an electrode conductive paste composed of aluminum as a main component, a glass fit, an organic vehicle, and so forth using a screen printing method or the like at the time of the formation of the transverse finger electrodes 8 and the longitudinal finger electrodes 10 to form a desired form, and then firing.

The transverse finger electrodes 8, the auxiliary busbar electrodes 9, and the longitudinal finger electrodes 10 contain aluminum as a main component. Thus, BSF layers 14 where aluminum is diffused in the semiconductor substrate 2 in a high concentration are simultaneously formed in portions where these electrodes are formed.

The thickness of the auxiliary busbar electrodes 9 is preferably larger than those of the transverse finger electrodes 8 and the longitudinal finger electrodes 10. That is, the auxiliary busbar electrodes 9 serve to further collect photogenerated carriers collected as described above and thus are required to have low resistance. Hence, the auxiliary busbar electrodes 9 preferably have larger thickness and larger line width. The auxiliary busbar electrodes 9 have a thickness of, for example, about 30 to about 60 µm. When the auxiliary busbar electrodes 9, the transverse finger electrodes 8, and the longitudinal finger electrodes 10 are simultaneously formed by a screen printing method, only the auxiliary busbar electrodes 9 have larger thickness. Thus, after a paste for the transverse finger electrodes 8, the longitudinal finger electrodes 10, and the auxiliary busbar electrodes 9 is applied by printing and dried, the paste may be applied again in such a manner that only the auxiliary busbar electrodes 9 are stacked.

When the transverse finger electrodes 8 are composed of the same material as the end-portion electrodes 11 as described above, transverse finger electrodes 8a extending from the end-portion electrodes 11 in the second direction (X direction) as illustrated in FIG. 2 are preferably arranged as some of the plural transverse finger electrodes 8. That is, the arrangement of the transverse finger electrodes 8a extending from the end-portion electrodes 11 enables the collection of photogenerated carriers between the end-portion electrodes 11 and between the end-portion electrodes 11 and peripheral end portions of the semiconductor substrate 2. Furthermore, the end-portion electrodes 11 are connected to the auxiliary busbar electrodes 9; hence, photogenerated carriers are transferred to the busbar electrodes 7, thereby improving the photoelectric conversion efficiency of the solar cell 1.

When the transverse finger electrodes 8 are composed of the same material as the end-portion electrodes 11, the end-portion electrodes 11 are preferably thicker than the transverse finger electrodes 8.

<Solar Cell According to Another Embodiment>

Figure 6:
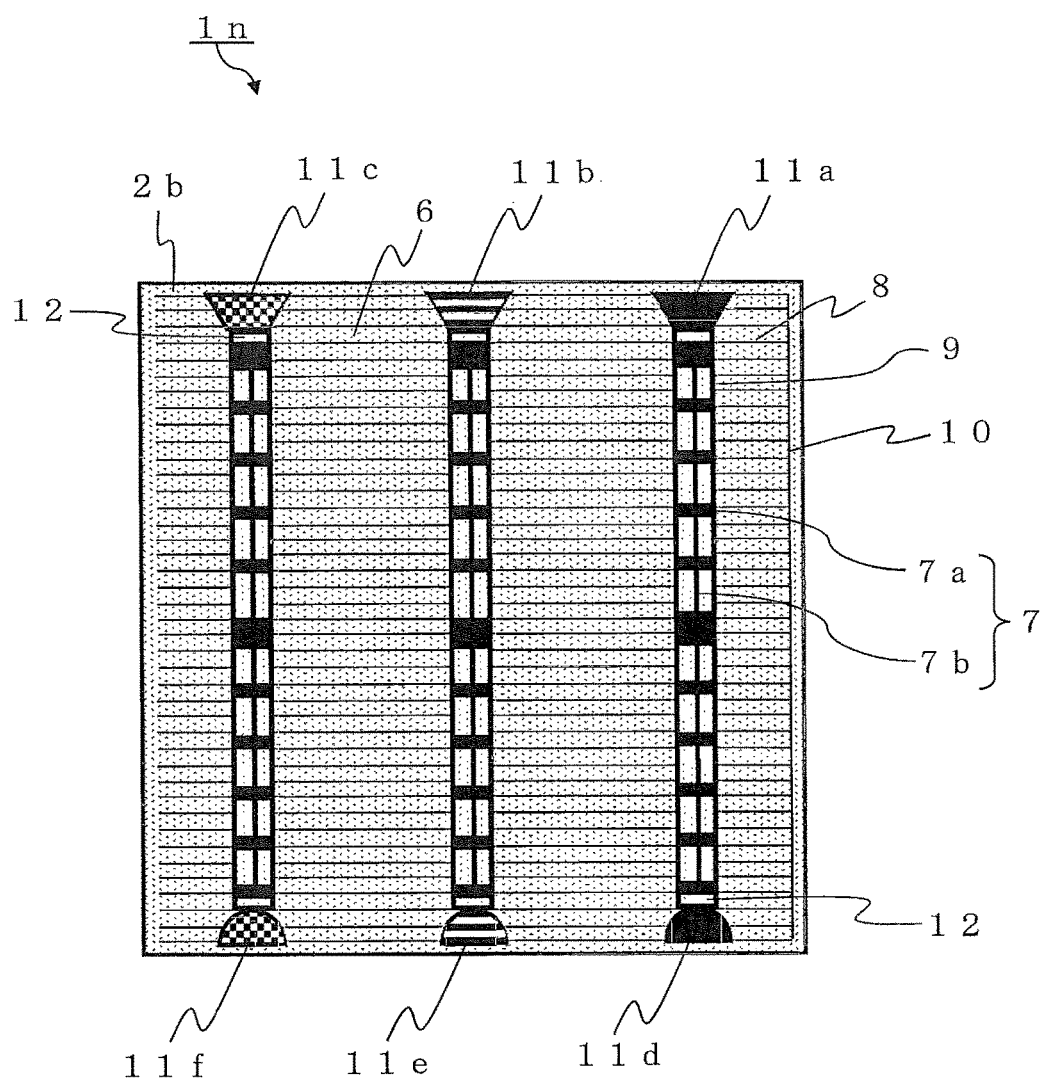
FIG. 6 is a schematic plan view of a solar cell according to another embodiment of the present invention when viewed from the side of a second main surface.

FIG. 6 illustrates a solar cell 1n according to another embodiment on the side of a surface on which light is not incident. The end-portion electrodes 11 of the solar cell 1n are trapezoidal end-portion electrodes 11a to 11c or semicircular or semielliptical end-portion electrodes 11d to 11f. For these shapes, in connecting the conductive leads 22 to the busbar electrodes 7, even if the conductive leads 22 are not in parallel to the busbar electrodes 7 and are obliquely connected to the busbar electrodes 7, the conductive leads 22 are less likely to come into contact with the end portions of the semiconductor substrate 2. Furthermore, the use of the shapes results in a reduction in the area of the end-portion electrodes 11 to lessen damage to the passivation film 6, thereby improving the photoelectric conversion efficiency of the solar cell 1m.

The end-portion electrodes 11 of the solar cell 1n may be the end-portion electrodes 11a and 11d, which are solid electrodes, the end-portion electrodes 11b and 11e, in which slit-like patterns are formed inside thereof, and the end-portion electrodes 11c and 11f, in which grid-like patterns are formed inside thereof. When the end-portion electrodes 11 have slit- or grid-like patterns formed inside thereof, it is possible to lessen damage to the passivation film 6 and improve the photoelectric conversion efficiency of the solar cell 1n.

<Examples of Insulating Pad>

As illustrated in FIGS. 5 to 7, insulating pads 41 may be used as pads, in place of the end-portion electrodes 11.

The insulating pads 41 are spaced apart from the busbar electrodes 7 on both end-portion sides of the busbar electrodes 7 in the first direction with gap portions 12 as described in the case of the end-portion electrodes 11 illustrated in FIG. 4. The insulating pads 41 are thicker than the busbar electrodes 7. For example, when each of the busbar electrodes 7 has a thickness of about 2 to about 15 µm as described above, each of the insulating pads 41 is formed so as to have a thickness of about 20 to about 60 µm. The insulating pads 41 are composed of an insulating resin, for example, an epoxy resin, a silicone resin, a phenolic resin, polyurethane, or polyimide, having a volume resistivity of $1 \times 10^8$ Ω·cm or more after curing. When the insulating pads 41 are formed by, for example, a screen printing method, the foregoing thickness of the insulating pads 41 can be achieved by adjusting the viscosity of an uncured resin used, the thickness of an emulsion coating of a screen mask used, the size of a mesh opening, and so forth. The insulating pads 41 are preferably composed of a material having the following properties: high hardness after curing, good insulating properties, curable at normal temperature, and a low shrinkage ratio during curing. Examples of the material include two-component epoxy resins. A component in which an adhesive material is applied to a resin film composed of polyethylene terephthalate (PET) or the like may also be used for the insulating pads 41.

In this embodiment, the conductive leads 22 connected to the busbar electrodes 7 is more likely to extend obliquely upward from the end portions of the busbar electrodes 7 because the insulating pads 41 are thicker than the busbar electrodes 7. The conductive leads 22 are arranged on top faces of the insulating pads 41. In this embodiment, even if a pressure is vertically applied to the solar cell 1 in the production process of a solar cell module, the pressure is received by the top faces of the insulating pads 41. Thus, the end portions of the semiconductor substrate 2 are less likely to come into contact with the conductive leads 22. As a result, in this embodiment, the pressure is less likely to concentrate on the end portions of the semiconductor substrate 2, thus reducing the occurrence of cracking and chipping starting from the end portions of the semiconductor substrate 2.

The insulating pads 41 are composed of the insulating resin; hence, even if the resin reaches from the end portions of the second surface 2b of the semiconductor substrate 2 to side-face portions or the first surface 2a of the semiconductor substrate 2, the occurrence of leakage current due to a pn junction in the solar cell 1 is inhibited. In this embodiment, thus, the insulating pads 41 may extend to corner portions formed by the second surface 2b and the of the semiconductor substrate 2. In this embodiment, hence, the peripheral end portions of the solar cell 1 are further reinforced.

The insulating pads 41 may be formed by curing the resin at a relatively low temperature of 100° C. or lower. This results in a reduction in damage to portions of the passivation film 6 located directly below the insulating pads 41, thereby suppressing a reduction in photoelectric conversion efficiency.

When the insulating pads 41 are composed of the insulating resin, solder are less likely to adhere thereto. Thus, thermal stress due to differences in thermal expansion coefficient among solder, the insulating pads 41, and the semiconductor substrate 2 is less likely to occur. This leads to the inhibition of peeling of the insulating pads 41 from the semiconductor substrate 2.

Each of the insulating pads 41 and a corresponding one of the busbar electrodes 7 may be arranged so as to be in contact with each other without arranging the gap portions 12. In this embodiment, the insulating pads 41 are separated from the busbar electrodes 7 with the gap portions 12; hence, the conductive leads 22 are curved upward to the insulating pads 41 at the gap portions 12. It is thus possible to perform soldering in such a manner that substantially uniform-thick solder is provided to portions in the vicinities of the end portions of the busbar electrodes 7. This is more likely to lead to the production of highly reliable solar cell module.

The auxiliary busbar electrodes 9 may include extensions 9a which pass through the outside of the end portions of the insulating pads 41 in the first direction or directly below the insulating pads 41 and which extend and are connected to the outermost transverse finger electrodes 8a. Owing to the arrangement of the extensions 9a, photogenerated carriers collected by the transverse finger electrodes 8a located in the second direction of the insulating pads 41 and the auxiliary finger electrodes 10 can also be collected at the busbar electrodes 7 to improve the photoelectric conversion efficiency of the solar cell 1.

Figure 13:
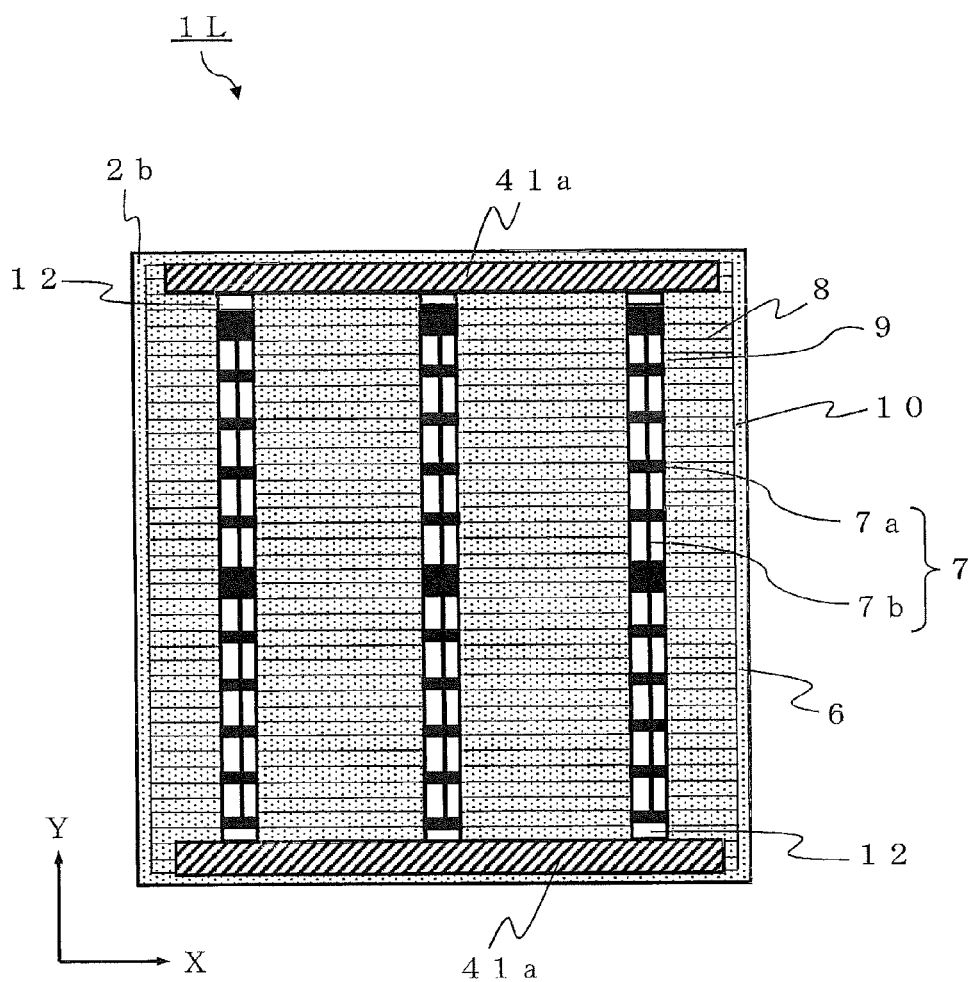
FIG. 13 is a schematic plan view of a solar cell according to another embodiment of the present invention when viewed from the side of a second main surface.

Other embodiments will be further described below. As illustrated in FIG. 13, in a solar cell 1L, a plurality of the busbar electrodes 7 are arranged on the second surface 2b of the semiconductor substrate 2 and spaced apart from each other. In this embodiment, three busbar electrodes 7 extending in the Y direction are spaced apart from each other in the X direction. In this case, insulating pads 41a of the solar cell 1L are arranged so as to extend over extensions of adjacent busbar electrodes 7. In this embodiment, thus, the length of the insulating pads 41a in the second direction (X direction in FIG. 13) is greater than that in the foregoing embodiment. Hence, in this embodiment, the end portions of the semiconductor substrate 2 in the direction of extension of the conductive leads 22 are further reinforced. In this embodiment, furthermore, even if the conductive leads 22 are slightly obliquely connected to the busbar electrodes 7, the conductive leads 22 are less likely to come into contact with the end portions of the semiconductor substrate 2. In this embodiment, the insulating pads 41 may extend over adjacent busbar electrodes 7, instead of the extensions of the busbar electrodes 7.

Figure 14:
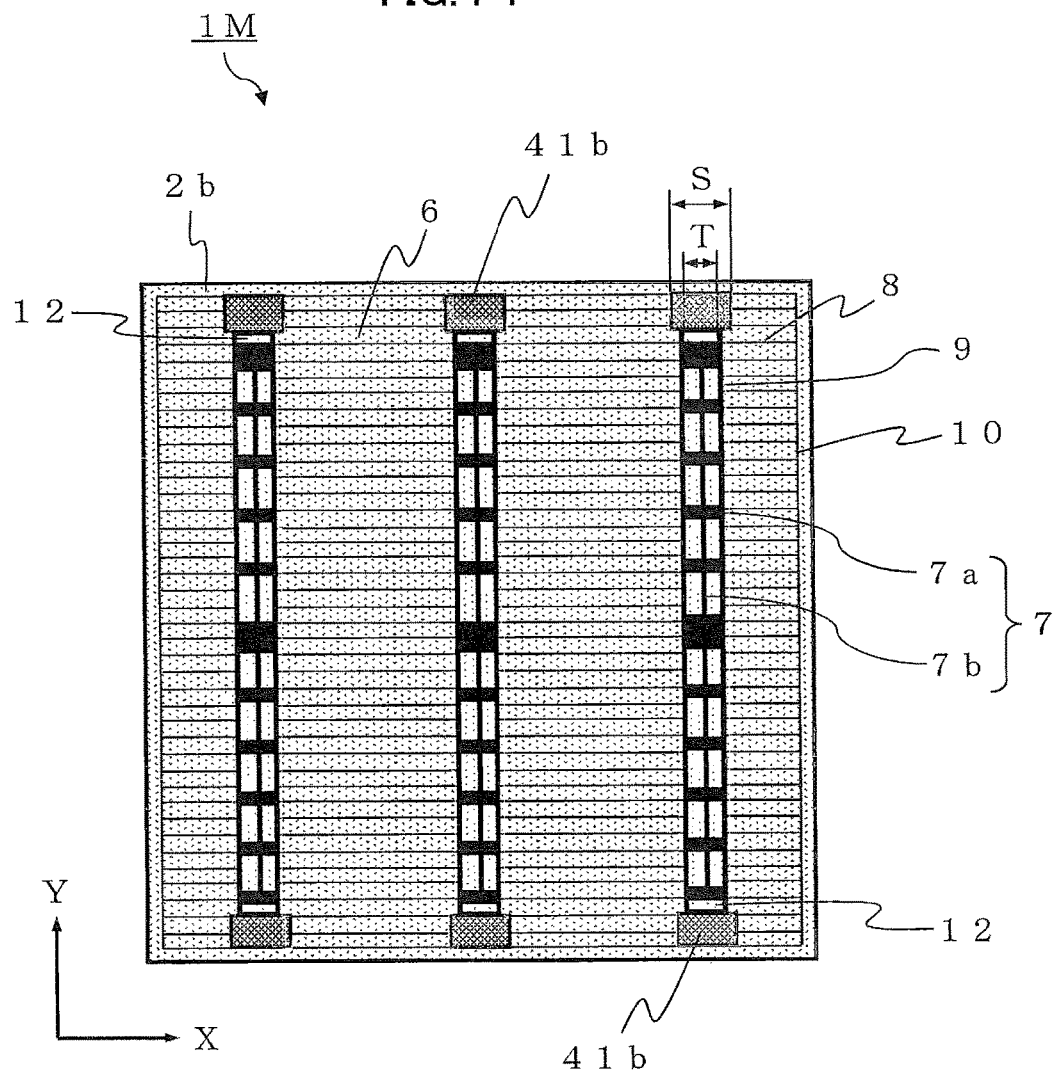
FIG. 14 is a schematic plan view of a solar cell according to another embodiment of the present invention when viewed from the side of a second main surface.

As illustrated in FIG. 14, a solar cell 1M according to another embodiment differs from other embodiments in that the width, S, of insulating pads 41b is larger than the width, T, of portions (that is, the island portions 7a) of the busbar electrodes to which the conductive leads 22 are connected. In this embodiment, in connecting the conductive leads 22 to the busbar electrodes 7, even if the conductive leads 22 are slightly obliquely connected to the busbar electrodes 7, the relatively small insulating pads 41 make the conductive leads 22 less likely to come into contact with the end portions of the semiconductor substrate 2.

Figure 15:
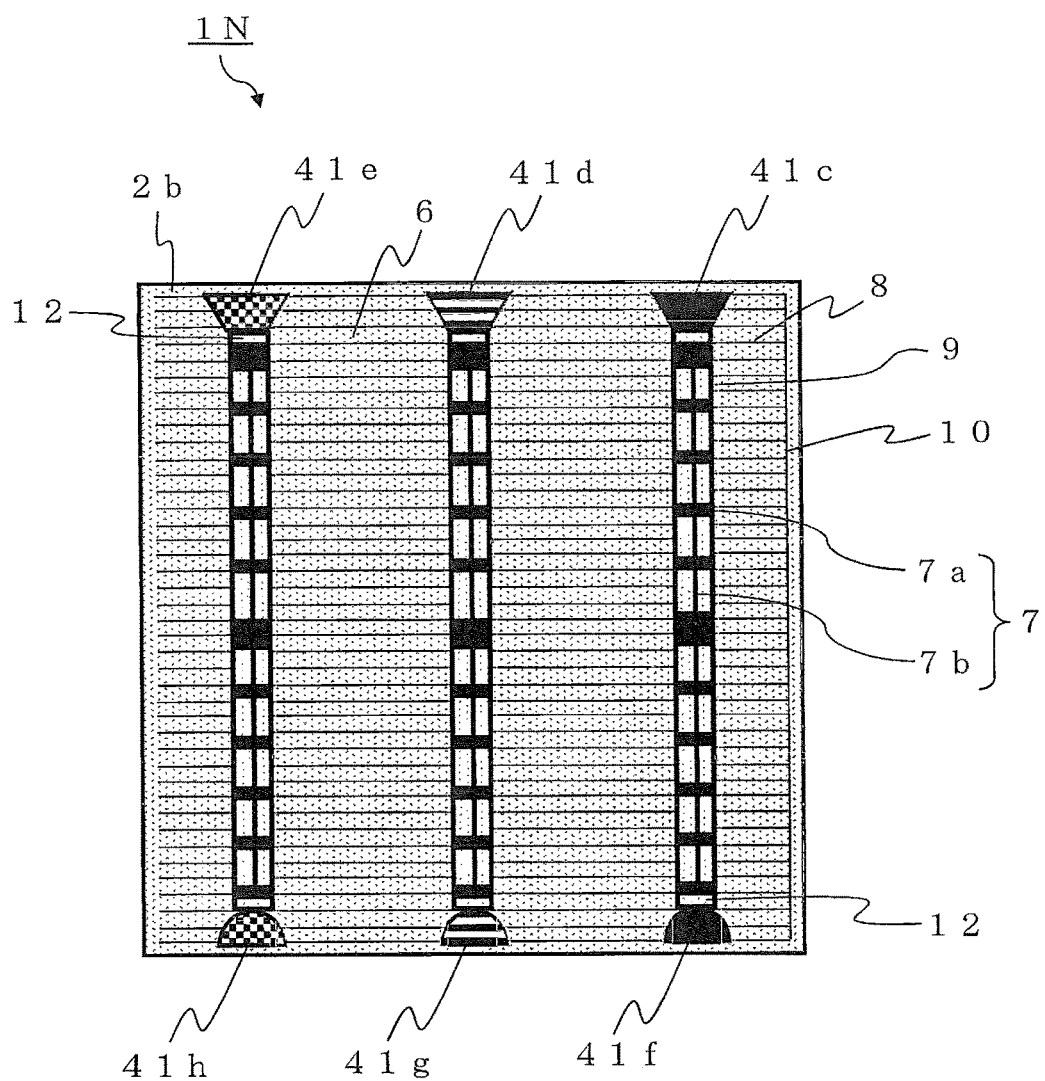
FIG. 15 is a schematic plan view of a solar cell according to another embodiment of the present invention when viewed from the side of a second main surface.

As illustrated in FIG. 15, the insulating pads 41 of a solar cell 1N according to another embodiment are trapezoidal insulating pads 41c to 41 e, or semicircular or semielliptical insulating pads 41f to 41h. For these shapes, in connecting the conductive leads 22 to the busbar electrodes 7, even if the conductive leads 22 are slightly obliquely connected to the busbar electrodes 7, this structure makes the conductive leads 22 less likely to come into contact with the end portions of the semiconductor substrate 2. In this embodiment, the insulating pads 41 have small areas, thus inhibiting the occurrence of warping of the solar cell 1N due to the shrinkage of the insulating resin during curing.

The insulating pads 41 of the solar cell 1N may be the insulating pads 41c and 41f, which are solid electrodes, the insulating pads 41d and 41g, in which slit-like patterns are formed inside thereof, and the insulating pads 41e and 41h, in which grid-like patterns are formed inside thereof. When the insulating pads 41 have slit- or grid-like patterns formed inside thereof, it is possible to further inhibit the occurrence of warping of the solar cell 1N due to the shrinkage of the insulating resin during curing.

<Method for Producing Solar Cell>

A method for producing the solar cell 1 will be described below.

Figure 7A:
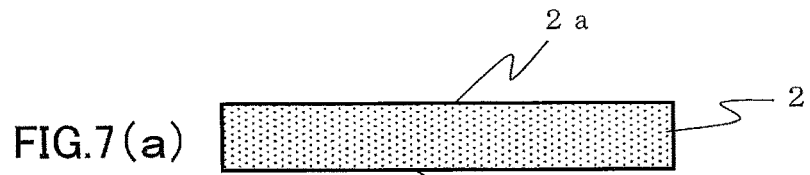
FIGS. 7(a) to 7(f) are schematic cross-sectional views illustrating a production process of a solar cell according to an embodiment of the present invention.

As illustrated in FIG. 7(a), the semiconductor substrate 2 including a layer with a conductivity type is prepared. As the semiconductor substrate 2, a p-type silicon substrate which is doped with, for example, boron serving as a dopant and has a first conductivity type may be used. As the silicon substrate, a single-crystal or polycrystalline silicon substrate sliced from a silicon ingot may be used and preferably has a resistivity of about 0.2 to about 2 Ω·cm. The silicon substrate may be a square or rectangle with a side of, for example, about 140 to about 180 mm and may have a thickness of about 100 μm to about 250 μm. When the semiconductor substrate 2 is a single-crystal silicon substrate, the substrate is produced by, for example, a floating zone (FZ) method or a Czochralski (CZ) method. When the semiconductor substrate 2 is a polycrystalline silicon substrate, a polycrystalline silicon ingot is produced by, for example, a casting method, and then the ingot is sliced into the semiconductor substrate 2 with a predetermined thickness. Descriptions will be given below by taking a p-type polycrystalline silicon as an example.

Preferably, surfaces of the semiconductor substrate 2 are lightly etched with a solution of sodium hydroxide, a solution of potassium hydroxide, or a solution of hydrofluoric acid and nitric acid in order to remove a mechanically damaged layer and a contamination layer on a cut surface. After this etching step, a fine irregular structure (texture) is preferably formed on the first main surface 2a of the semiconductor substrate 2 by a wet etching method or a dry etching method, such as a reactive ion etching (RIE) method. The formation of the texture reduces optical reflectivity of the first main surface 2a to improve the photoelectric conversion efficiency of the solar cell 1.

Figure 7B:
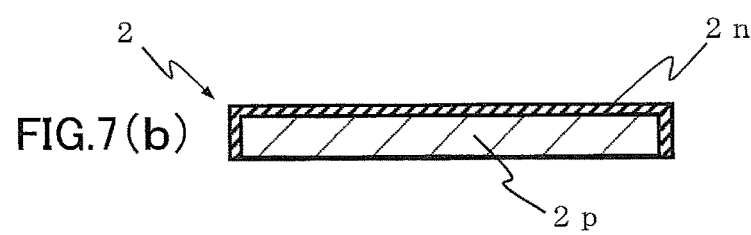

As illustrated in FIG. 7(b), the n-type second semiconductor portion 2n is formed on the first semiconductor portion 2p of the semiconductor substrate 2 on the first main surface 2a side. The second semiconductor portion 2n is formed by diffusing an n-type impurity (for example, phosphorus) into a surface layer on the first main surface 2a side. Examples of a method of diffusion include an application and thermal diffusion process in which phosphorus pentoxide ($P_2O_5$) in the form of a paste is applied to a surface of the semiconductor substrate 2 and thermally diffused; a vapor-phase thermal diffusion process in which gaseous phosphorus oxychloride ($POCl_3$) is used as a diffusion source; and an ion implantation process in which phosphorus ions are directly diffused. The second semiconductor portion 2n is formed so as to have a thickness of, for example, about 0.1 to about 1 μm and a sheet resistance of about 40 to about 150Ω/□. When an opposite conductivity-type layer is formed on the second main surface 2b side in forming the second semiconductor portion 2n, only the second main surface 2b side is removed by etching to expose a p-type conductivity region. For example, only the second main surface 2b side of the semiconductor substrate 2 is immersed in a solution of hydrofluoric acid and nitric acid to remove the second semiconductor portion 2n on the second main surface 2b side. Furthermore, a similar structure may be formed by a process that includes forming a diffusion preventing mask composed of silicon oxide or the like on the second main surface 2b side in advance, forming the second semiconductor portion 2n by the vapor-phase thermal diffusion process or the like, and removing the diffusion mask.

Figure 7C:
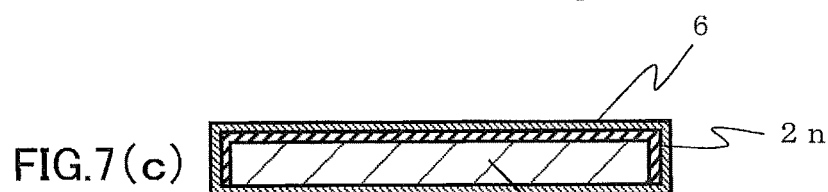

As illustrated in FIG. 7(c), the passivation film 6 is formed on almost all areas of both surfaces of the semiconductor substrate 2 on the first main surface 2a side and the second main surface 2b side. The passivation film 6 may be simultaneously formed on all surfaces of the semiconductor substrate 2 by, for example, an ALD method. To form the passivation film 6 composed of, for example, aluminum oxide by the ALD method, a method described below is employed.

The semiconductor substrate 2 is placed in a film formation chamber. The substrate temperature is increased to 100° C. to 300° C. by heating. An aluminum source, such as trimethylaluminum, is fed onto the semiconductor substrate 2 for 0.5 seconds with a carrier gas, for example, argon gas or nitrogen gas, to allow the aluminum source to be adsorbed on the entire circumference of the semiconductor substrate 2 (PS step 1).

The firm formation chamber is purged with nitrogen gas for 1 second to remove the aluminum source in a space and the aluminum source adsorbed on the semiconductor substrate 2 other than components adsorbed on the semiconductor substrate 2 at an atomic layer level (PS step 2).

An oxidizing agent, for example, water or ozone gas, is fed into the film formation chamber for 4 seconds to remove the alkyl ($CH_3$) groups of trimethylaluminum serving as the aluminum source to oxidize dangling bonds of aluminum, thereby forming an atomic layer of aluminum oxide on the semiconductor substrate 2 (PS step 3).

The film formation chamber is purged with nitrogen gas for 1.5 seconds to remove the oxidizing agent in the space and components, for example, the oxidizing agent that has not contributed to the reaction, other than aluminum oxide present in the atomic layer level (PS step 4).

Repeating the film formation PS steps 1 to 4 provides the passivation film 6 composed of aluminum oxide, the passivation film 6 having a predetermined thickness. By incorporating hydrogen into the oxidizing agent used in the PS step 3, the aluminum oxide layer can easily contain hydrogen, thereby increasing the effect of hydrogen passivation.

The use of the ALD method for the formation of the passivation film 6 results in the formation of the aluminum oxide layer in response to the fine irregularities on the surface of the semiconductor substrate 2 to enhance the effect of surface passivation because of the formation.

Figure 7D:
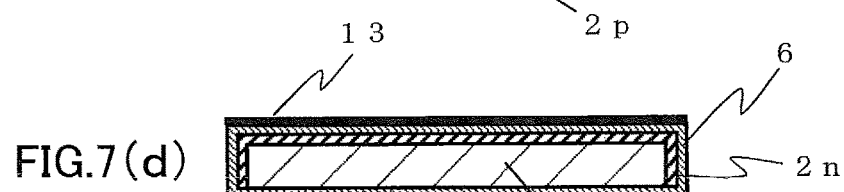

As illustrated in FIG. 7(d), the antireflection film 13 is formed on the passivation film 6 on the side of the first main surface 2a of the semiconductor substrate 2. The antireflection film 13 is formed of a film composed of, for example, silicon nitride, titanium oxide, silicon oxide, or aluminum oxide, the film being formed by, for example, a plasma-enhanced chemical vapor deposition (PECVD) method, a thermal CVD method, an evaporation method, or a sputtering method. For example, when the antireflection film 13 formed of a silicon nitride film by the PECVD method, the antireflection film 13 is formed by setting the temperature of the inside of a reaction chamber to about 500° C., diluting a gas mixture of silane ($SiH_4$) and ammonia ($NH_3$) with nitrogen ($N_2$), forming the gas mixture into plasmas by glow discharge decomposition, and depositing the plasmas.

Figure 7E:
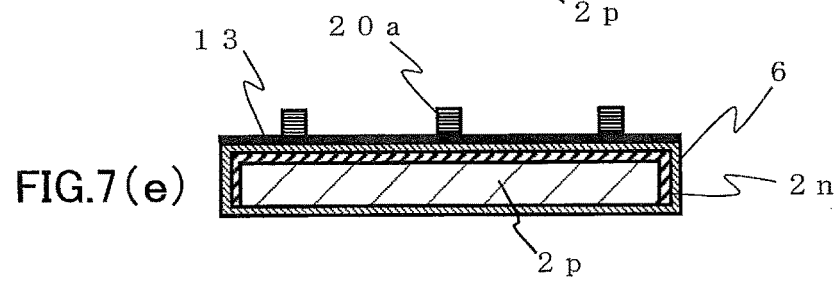

As illustrated in FIG. 7(e), a first conductive paste 20a for the formation of the first electrode (the connection electrodes 3, the collector electrodes 4, and the auxiliary collector electrode 5) is applied. The first electrode (the connection electrodes 3, the collector electrodes 4, and the auxiliary collector electrode 5) is prepared with a conductive paste containing a conductive component, such as silver (or copper or a silver-copper alloy), a glass frit, and an organic vehicle. The conductive paste contains silver (or copper or a silver-copper alloy) as a main component. The organic vehicle is formed by, for example, dissolving a resin component serving as a binder in an organic solvent. Examples of the binder used include cellulosic resins, such as ethyl cellulose; acrylic resins; and alkyd resins. Examples of the organic solvent used include terpineol and diethylene glycol monobutyl ether. The content by mass of the organic vehicle is preferably about 6 parts by mass or more and about 20 parts by mass or less with respect to the total mass (100 parts by mass) of the conductive component, such as silver. Regarding components of the glass frit, as a glass material, a lead-based glass, for example, a $SiO_2$—$Bi_2O_3$—PbO-based glass or an $Al_2O_3$—$SiO_2$—PbO-based glass, may be used. In addition, a lead-free glass, for example, a $B_2O_3$—$SiO_2$—$Bi_2O_3$-based glass or a $B_2O_3$—$SiO_2$—ZnO-based glass, may be used. The content of the glass fit is preferably about 2 parts by mass or more and about 13 parts with respect to the total mass (100 parts by mass) of the conductive component, such as silver.

The first conductive paste 20a is applied by, for example, screen printing method to the antireflection film 13 on the first main surface 2a of the semiconductor substrate 2 and then dried. For example, the connection electrodes 3 are formed so as to have a width (size) of about 1 to about 3 mm. For example, the collector electrodes 4 and the auxiliary collector electrode 5 are formed so as to have a width of about 0.05 to about 0.2 mm.

Figure 7F:
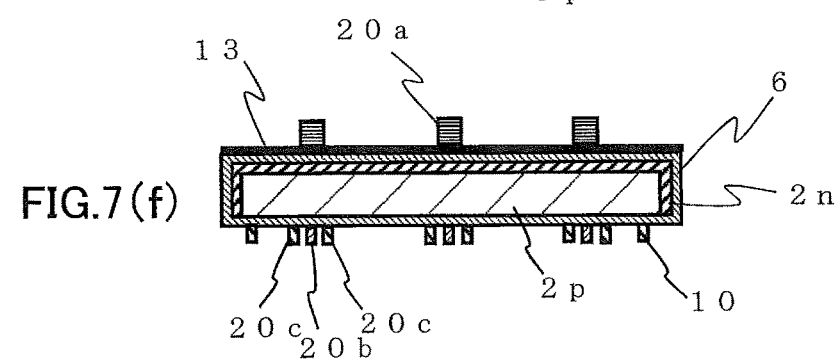

As illustrated in FIG. 7(f), a second conductive paste 20b and a third conductive paste 20c for the formation of a second electrode including the busbar electrodes 7, the transverse finger electrodes 8, the auxiliary busbar electrodes 9, the longitudinal finger electrodes 10, and the end-portion electrodes 11 are applied to the passivation film 6. First, the second conductive paste 20b for the formation of the busbar electrodes 7 (the island portions 7a and the linear portion 7b) is applied. For example, the busbar electrodes 7 are formed so as to have a width (X direction in FIG. 2) of about 3 to about 8 mm and a length (Y direction in FIG. 2) of about 2 to about 8 mm. As the conductive paste, a conductive paste similar to the conductive paste used for the formation of the first electrode may be used. The conductive paste is applied by a screen printing method and the dried.

Next, the third conductive paste 20c for the formation of the transverse finger electrodes 8, the auxiliary busbar electrodes 9, the longitudinal finger electrodes 10, and the end-portion electrodes 11 is applied. The conductive paste for the formation of these electrodes is formed of an aluminum paste containing a metal powder that contains aluminum as a main component, a glass frit, and an organic vehicle. The aluminum powder has an average particle diameter of about 3 to about 20 µm. The organic vehicle is a binder dissolved in an organic solvent as described above. As the glass frit, for example, a $SiO_2$—Pb-based, $SiO_2$—$B_2O_3$—PbO-based, or $Bi_2O_3$—$SiO_2$—$B_2O_3$-based glass frit may be used.

The aluminum paste has a composition of 60% by weight or more and 85% by weight or less of the aluminum powder, 5% by weight or more and 25% by weight or less of the organic vehicle, and 0.1% by weight or more and 10% by weight or less of the glass frit with respect to the total weight of the aluminum paste. To reduce the warping and the resistivity of the semiconductor substrate 2 after firing, for example, zinc oxide (ZnO), silicon oxide ($SiO_2$), or aluminum oxide ($Al_2O_3$) may be added thereto. For example, each of the transverse finger electrodes 8 has a width of about 0.1 to about 0.7 mm. Each of the auxiliary busbar electrodes 9 has a width of about 0.3 to about 1 mm. Each of the longitudinal finger electrodes 10 has a width of about 0.1 to about 0.7 mm. Each of the end-portion electrodes 11 has a width (in the X direction in FIG. 2) of about 3 to about 10 mm and a length (in the Y direction in FIG. 2) of about 3 to about 10 mm. Each of the gaps 12 has a width of about 0.1 to about 2 mm. Each of the end-portion electrodes 11 is formed in such a manner that the distance from the end portions of the semiconductor substrate 2 to the respective end-portion electrodes 11 is about 0.1 to about 2 mm.

Subsequently, the semiconductor substrate 2 to which the first conductive paste 20a for the formation of the finger electrode, the second conductive paste 20b for the formation of the second electrode, and the third conductive paste 20c have been applied is fired at a peak temperature of 600° C. to 800° C. for several tens of seconds to several tens of minutes. Thereby, the electrodes are formed to complete the solar cell 1.

The structure of the solar cell according to the present invention and the method for producing the solar cell are not limited to the foregoing description. Various changes and modifications can be made without departing from the scope of the invention. For example, the passivation film 6 may be arranged only on the side of the second main surface 2b, instead of both surfaces of the semiconductor substrate 2 on the first main surface 2a side and the second main surface 2b side.

<Solar Cell Module>

Figure 8A:
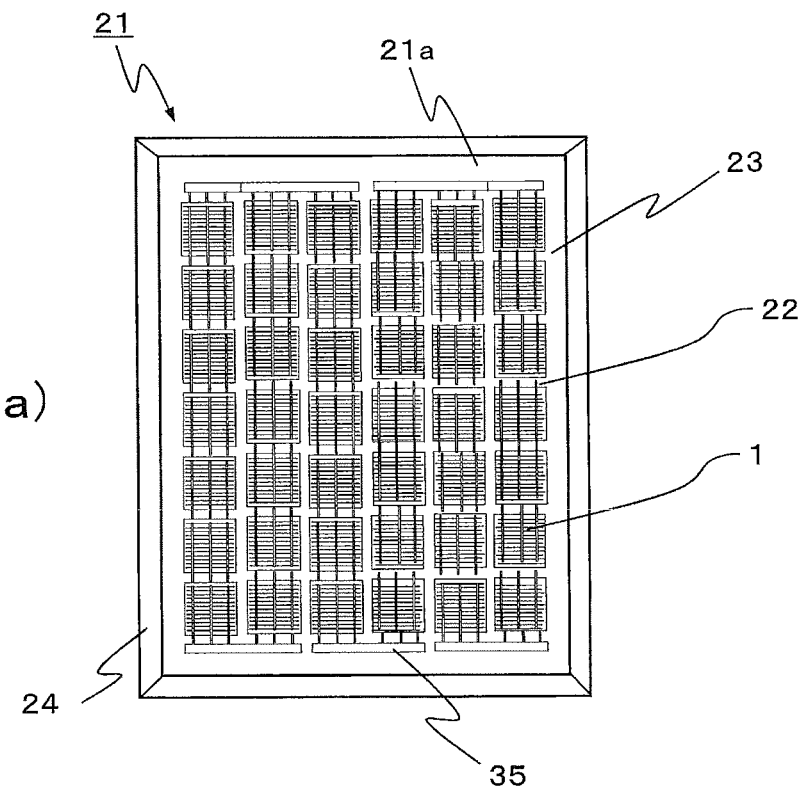
FIG. 8(a) is a schematic plan view illustrating a first surface side of a solar cell module according to an embodiment of the present invention.
Figure 8B:
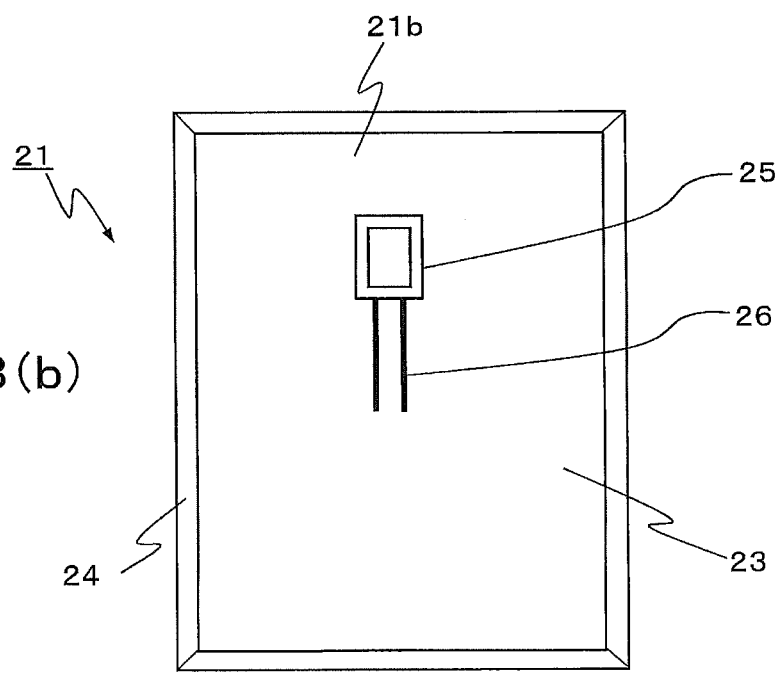
FIG. 8(b) is a schematic plan view illustrating a second surface side according to an embodiment.

As illustrated in FIGS. 8(a) and 8(b), a solar cell module 21 according to an embodiment of the present invention includes a solar cell panel 23 including a plurality of the solar cells 1; and a frame 24 arranged at an outer peripheral portion of the solar cell panel 23. The solar cell module 21 includes a first surface 21a mainly serving as a light-receiving surface as illustrated in FIG. 8(a); and a second surface 21b corresponding to the backside of the first surface 21a as illustrated in FIG. 8(b). The solar cell module 21 further includes a terminal box 25 or the like on the second surface 21b side. The terminal box 25 is connected to output cables 26 configured to supply an external circuit with electric power generated by the solar cell module 21.

Adjacent solar cells 1 among the solar cells 1 arranged in one direction are electrically connected to each other with the conductive leads 22 as illustrated in FIGS. 8 and 9. Each of the conductive leads 22 is formed of, for example, strip metal foil composed of copper, aluminum, or the like, the strip metal foil having a thickness of about 0.1 to about 0.3 mm. The metal foil is coated on its surface with solder. The solder is arranged by, for example, plating or dipping so as to have a thickness of, for example, about 10 to about 50 µm. The width of each of the conductive leads 22 may be equal to or smaller than the width of a corresponding one of the connection electrodes 3. Thus, the conductive leads 22 are less likely to interfere with the reception of light by the solar cell 1. The conductive leads 22 may be connected to almost all surfaces of the connection electrodes 3 and the busbar electrodes 7. This structure results in a reduction in the electrical resistance component of the solar cells 1. When two square solar cells 1 having a side of about 150 mm are connected to each other with the conductive leads 22, each of the conductive leads 22 may have a width of about 1 to about 3 mm and length of about 260 to about 300 mm.

Figure 9A:
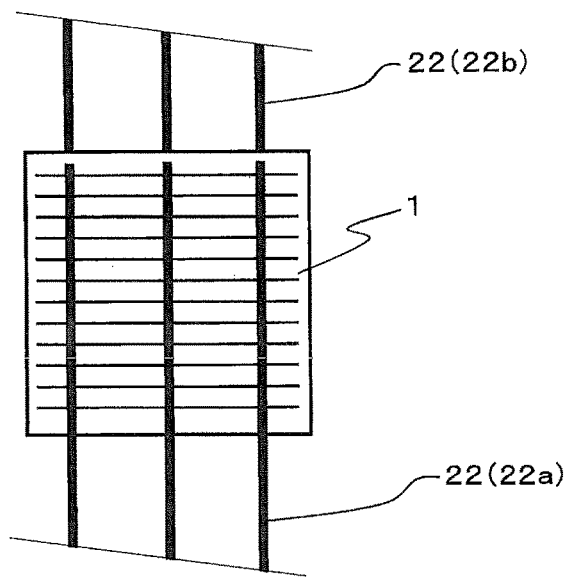
FIG. 9(a) is a schematic cross-sectional view of a state in which conductive leads are connected to a solar cell according to an embodiment of the present invention.

Regarding the conductive leads 22 connected to one of the solar cells 1, first conductive leads 22a are soldered to the busbar electrodes 3 on the first main surface 2a of the solar cell 1 as illustrated in FIG. 9(a). Second conductive leads 22*b* are soldered to the busbar electrodes 7 on the second main surface 2*b* of the solar cell 1.

As illustrated in FIG. 9(*b*), adjacent solar cells 1 (solar cells 1S and 1T) are connected together by soldering the other ends of the conductive leads 22 connected to the busbar electrodes 3 on the first main surface 2*a* of the solar cell 1S to the busbar electrodes 7 on the second main surface 2*b* of the solar cell 1T. The connecting operation is repeated for a plurality of the solar cells 1 (for example, about 5 to about 10 solar cells) to form solar cell strings in which the plural solar cells 1 are serially connected together in the form of a straight line.

The plural solar cell strings (for example, about 2 to about 10 strings) are prepared and arranged in an almost parallel manner at predetermined intervals of about 1 to about 10 mm. The solar cells 1 located at end portions of the solar cell strings are connected to each other by, for example, soldering with transverse leads 35. The solar cells 1 which are located at two end portions of the solar cell strings and which are not connected to the transverse leads 35 are connected to extraction leads 36.

A transparent substrate 31, a front-side filling material 32, a back-side filling material 33, and a back-side material 34 are prepared. As the transparent substrate 31, a substrate composed of, for example, glass or a polycarbonate resin is used. As the glass, for example, white tempered glass, double-tempered glass, or heat-reflecting glass is used. As the resin, a synthetic resin, such as a polycarbonate resin, is used. The transparent substrate 31 composed of white tempered glass may have a thickness of about 3 to about 5 mm.

Each of the front-side filling material 32 and the back-side filling material 33 is used in the form of a sheet produced with a T-die and an extruder, the sheet having a thickness of about 0.4 to about 1 mm and being composed of an ethylene-vinyl acetate copolymer (hereinafter, abbreviated as "EVA") and polyvinyl butyral (PVB). These materials are heated and pressed under reduced pressure with a laminating apparatus, so that these materials are soften, fused, and integrated with other members.

The back-side material 34 serves to inhibit the penetration of water from the outside. For the back-side material 34, for example, a weatherproof fluorine-containing resin sheet including aluminum foil is sandwiched or a polyethylene terephthalate (PET) sheet including alumina or silica deposited thereon is used. When light incident on the second surface 21*b* side of the solar cell module 21 is used for electric power generation, the back-side material 34 may be composed of, for example, glass or a polycarbonate resin.

Figure 10:
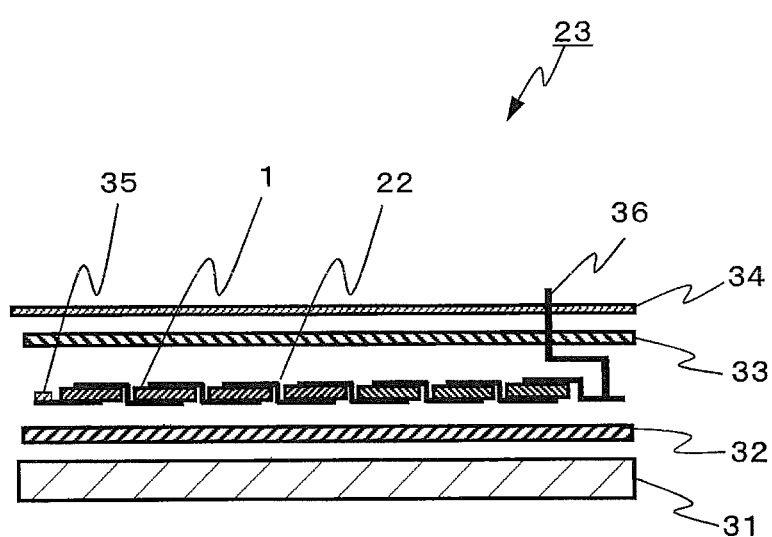
FIG. 10 is a cross-sectional view illustrating the structure of a solar cell module according to an embodiment of the present invention.

As illustrated in FIG. 10, after the front-side filling material 32 is arranged on the transparent substrate 31, the solar cells 1 connected as described above, the back-side filling material 33, the back-side material 34, and so forth are sequentially stacked to form a stack.

Next, the stack is placed in a laminating apparatus and heated under reduced pressure at 100° C. to 200° C. for, for example, about 15 minutes to about 1 hour with the stack pressed, thereby producing the solar cell panel 23.

Finally, the frame 24 is attached to the outer peripheral portion of the solar cell panel 23. The terminal box 25 is attached to the second surface 21*b* side of the solar cell panel 23. Thereby, the solar cell module 21 illustrated in FIGS. 8(*a*) and 8(*b*) is completed.

In the solar cell module 21, the use of the solar cells 1 described above inhibits the occurrence of cracking, chipping, and so forth of the solar cells due to, for example, wind pressure when the solar cell module 21 is placed in an outdoor location. Consequently, it is possible to provide the solar cell module 21 having an improved yield and high reliability. Furthermore, the solar cell module 21 includes the passivation film 6 and thus has improved photoelectric conversion efficiency.

EXAMPLES

Production of Solar Cell of Example

A solar cell of an example was produced as described below.

As illustrated in FIG. 7(*a*), a p-type polycrystalline silicon substrate doped with boron was prepared as the semiconductor substrate 2, the p-type polycrystalline silicon substrate having a resistivity of about 1.0 Ω·cm, a square planar form with a side of about 156 mm, and a thickness of about 200 μm. The semiconductor substrate 2 was produced by a casting method.

The semiconductor substrate 2 was etched with an aqueous solution of NaOH to a depth of about 7 to about 12 μm from the surfaces. Then a fine texture was formed on the first main surface 2*a* side by an RIE method.

An n-type region was formed on all surfaces of the semiconductor substrate 2 by a vapor-phase thermal diffusion process with phosphorus oxychloride (POCl$_3$) serving as a diffusion source. The n-type region was formed so as to have a sheet resistance of about 50 to about 100Ω/□. Only the back surface 2*b* side of the semiconductor substrate 2 was then dipped in a solution mixture of hydrofluoric acid and nitric acid to remove a portion of the n-type region on the second main surface 2*b* side. Thereby, the n-type second semiconductor portion 2*n* was formed on the first main surface 2*a* side of the semiconductor substrate 2 including the p-type first semiconductor portion 2*p*, as illustrated in FIG. 7(*b*).

As illustrated in FIG. 7(*c*), the passivation film 6 was formed on almost all surfaces on the first main surface 2*a* side and the back surface 2*b* side of the semiconductor substrate 2. The passivation film 6 was formed by depositing aluminum oxide to a thickness of about 30 to about 50 nm using the ALD method described above.

As illustrated in FIG. 7(*d*), the antireflection film 13 composed of silicon nitride was formed on the first main surface 2*a* of the semiconductor substrate 2 with a PECVD apparatus. The antireflection film 13 had a refractive index of about 2.1 to about 2.2 and a thickness of about 40 to about 90 nm.

As illustrated in FIG. 7(*e*), the first conductive paste 20*a* for the formation of electrodes (the connection electrodes 3, the collector electrodes 4, and the auxiliary collector electrode 5 illustrated in FIG. 1) on the first main surface 2*a* side was applied. The first conductive paste 20*a* used contained silver as a main component, a glass frit, an organic vehicle, and so forth. The first conductive paste 20*a* was applied by a screen printing method in a thickness of about 20 to about 30 μm so as to have a form as illustrated in FIG. 1, and then dried.

As illustrated in FIG. 7(*f*), the second conductive paste 20*b* for the formation of the busbar electrodes 7 as illustrated in FIG. 2 was applied to the passivation film 6 on the back surface 2*b* side. The second conductive paste 20*b* used contained silver as a main component, a glass frit, an organic vehicle, and so forth. The second conductive paste 20*b* was applied by a screen printing method so as to have a structure as illustrated in FIG. 2, the structure having a width (X direction in FIG. 2) of about 6.0 mm, a length (Y direction in FIG. 2) of about 3.2 mm, and a thickness of about 10 to 20 μm, and then dried.

The third conductive paste 20c for the formation of the transverse finger electrodes 8, the auxiliary busbar electrodes 9, the longitudinal finger electrodes 10, and the end-portion electrodes 11 as illustrated in FIG. 2 was applied on the back surface 2b side. The third conductive paste 20c for the formation of these electrodes contained aluminum as a main component, a glass frit, an organic vehicle, and so forth. The screen printing method was employed so as to form the structure as illustrated in FIG. 2. The third conductive paste 20c was applied in such a manner that each of the electrodes had dimensions described below, and then dried.

The semiconductor substrate 2 to which the first conductive paste 20a, the second conductive paste 20b, and the third conductive paste 20c had been applied was fired at a peak temperature of about 700° C. for about 10 minutes to form the electrodes, thereby producing the solar cell 1 of this example.

Regarding the dimensions of the electrodes, each of the transverse finger electrodes 8 had a width of about 0.3 mm. Each of the auxiliary busbar electrodes 9 had a width of about 0.5 mm. Each of the longitudinal finger electrodes 10 had a width of about 0.3 mm. Each of the end-portion electrodes 11 had a width (X direction in FIG. 2) of about 5.9 mm and a length (Y direction in FIG. 2) of about 5.8 mm. Each of the gaps 12 had a width of about 1 mm. The distance from the end portions of the semiconductor substrate 2 to the respective end-portion electrodes 11 was about 0.7 mm. Each of the end-portion electrodes 11 had a thickness of about 40 to about 50 μm.

<Production of Solar Cell of Comparative Example>

A solar cell 1R of a comparative example was produced. As illustrated in FIGS. 7(a) to 7(e), similarly to the solar cell 1 of the example described above, the same steps were performed under the same conditions, up to the application of the first conductive paste 20a for the formation of the electrodes on the first main surface 2a side.

Figure 11:
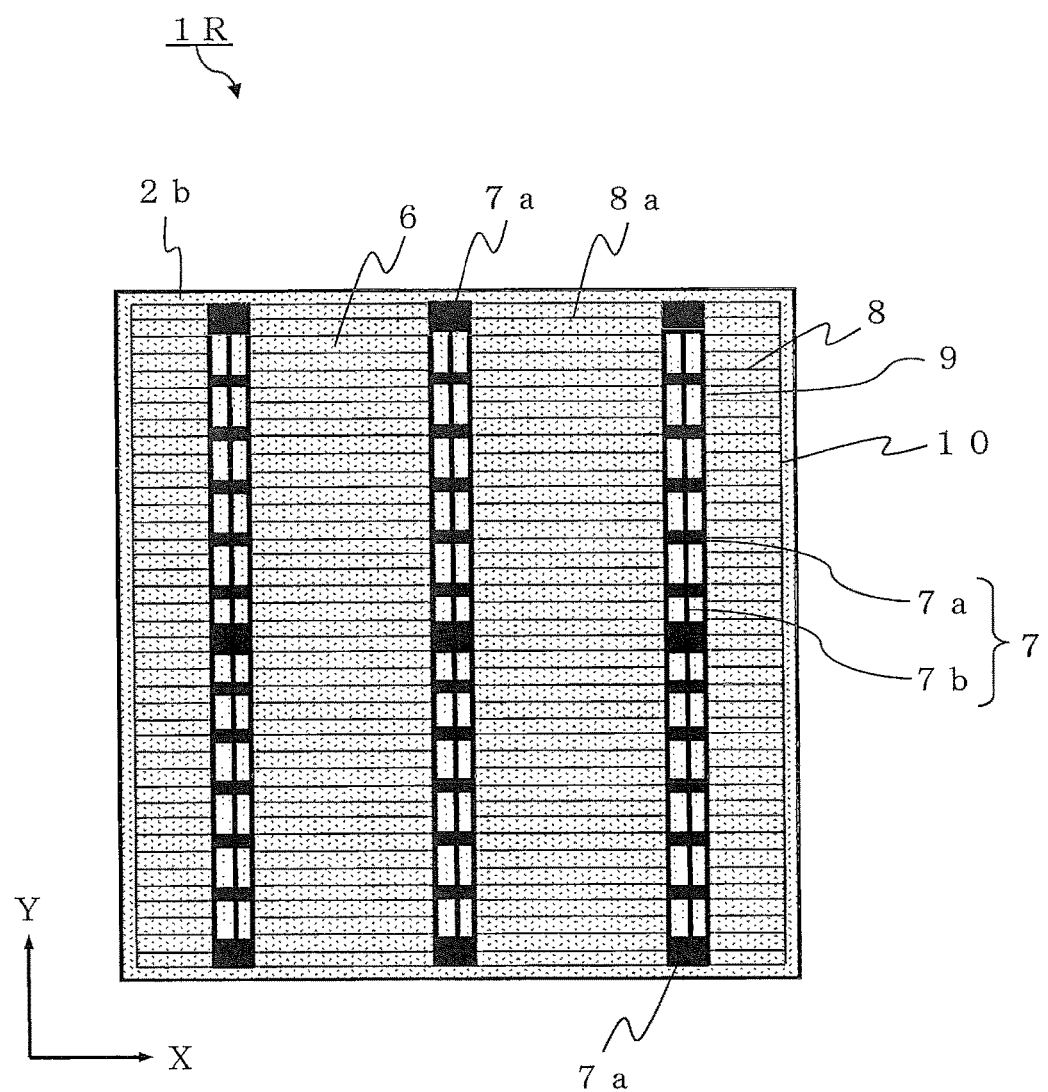
FIG. 11 is a schematic plan view of a solar cell according to a comparative example when viewed from the side of a second main surface.

The busbar electrodes 7, the transverse finger electrodes 8, the auxiliary busbar electrodes 9, and the longitudinal finger electrodes 10 as illustrated in FIG. 11 were formed on the passivation film 6 on the back surface 2b side of the solar cell 1R of the comparative example. That is, in the solar cell 1R of the comparative example, the busbar electrodes 7 extend to portions in the vicinities of the end portions of the semiconductor substrate 2. None of the end-portion electrodes are arranged. Instead of the end-portion electrodes, the island portions 7a are arranged in the vicinities of the end portions of the semiconductor substrate 2.

First, the second conductive paste 20b for the formation of the busbar electrodes 7 was applied. The second conductive paste 20b contained silver as a main component and was the same as that used in the production of the solar cell 1 of the example. The second conductive paste 20b was applied in substantially the same thickness by the same method under the same conditions, and then dried.

Subsequently, the third conductive paste 20c for the formation of the transverse finger electrodes 8, the auxiliary busbar electrodes 9, and the longitudinal finger electrodes 10 as illustrated in FIG. 11 was applied on the back surface 2b side. The third conductive paste 20c contained aluminum as a main component and was the same as that used in the production of the solar cell 1 of the example. The third conductive paste 20c was applied in substantially the same thickness by the same method under the same conditions, and then dried.

The semiconductor substrate 2 to which the first conductive paste 20a, the second conductive paste 20b, and the third conductive paste 20c were applied was fired with the same apparatus used for the solar cell of the example under the same conditions to form the electrodes, thereby producing the solar cell 1R of the comparative example.

<Production of Test Solar Cell Module>

Figure 9B:
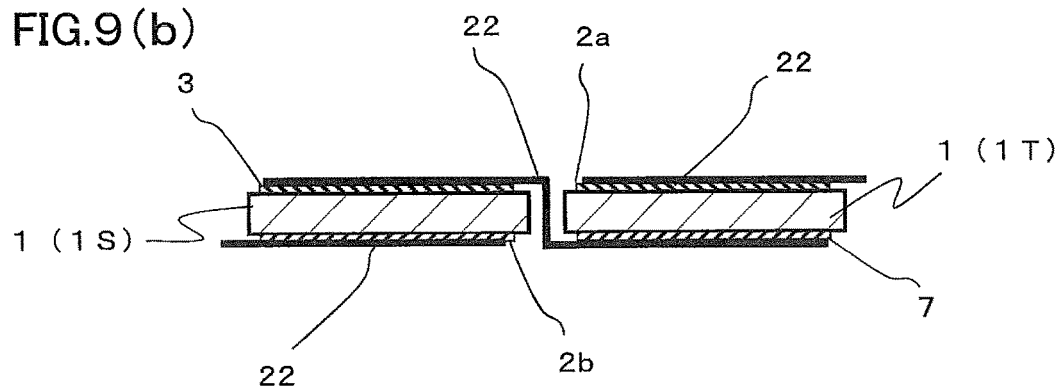
FIG. 9(b) is a schematic cross-sectional view illustrating a state of the connection between two solar cells.

Two types of solar cell modules including the solar cells of the example and the comparative example were produced. Solar cell strings included in the solar cell modules were produced as described below. Seven solar cells of the example and seven solar cells of the comparative example were prepared. As illustrated in FIG. 9(b), the solar cells were serially connected together by soldering with the conductive leads 22 to produce two types of solar cell strings including the solar cells of the example and the comparative example.

Six solar cell strings for the example and six solar cell strings for the comparative example were prepared for the production of the solar cell modules for the example and the comparative example. The six solar cell strings were arranged in an almost parallel manner. The solar cells located at end portions of each of the solar cell strings were connected to each other with the transverse leads 35 and the extraction leads 36 as illustrated in FIGS. 8(a) and 8(b).

As illustrated in FIGS. 8(a) and 8(b), the front-side filling material 32 was arranged on the transparent substrate 31. The six solar cell strings connected together, the back-side filling material 33, the back-side material 34, and so forth were sequentially stacked to form a stack. The stack was placed in a laminating apparatus and heated at about 100° C. to about 160° C. for about 20 minutes under reduced pressure with the stack pressed, thereby producing the solar cell panel 23.

The frame 24 was attached to the outer peripheral portion of the solar cell panel 23. The terminal box 25 was arranged on the second surface 21b side. In this way, the solar cell module 21 including the solar cells of the example and the solar cell module including the solar cells of the comparative example were completed.

<Load Test>

A load test was performed on the solar cell modules of the example and the comparative example. A load was applied to the first surface 21a side of each of the two solar cell modules 21 up to 6000 Pa in increments of 1000 Pa. The incidence of cracking occurred in a direction parallel to the direction in which the conductive leads 22 were arranged was visually observed.

Figure 12:
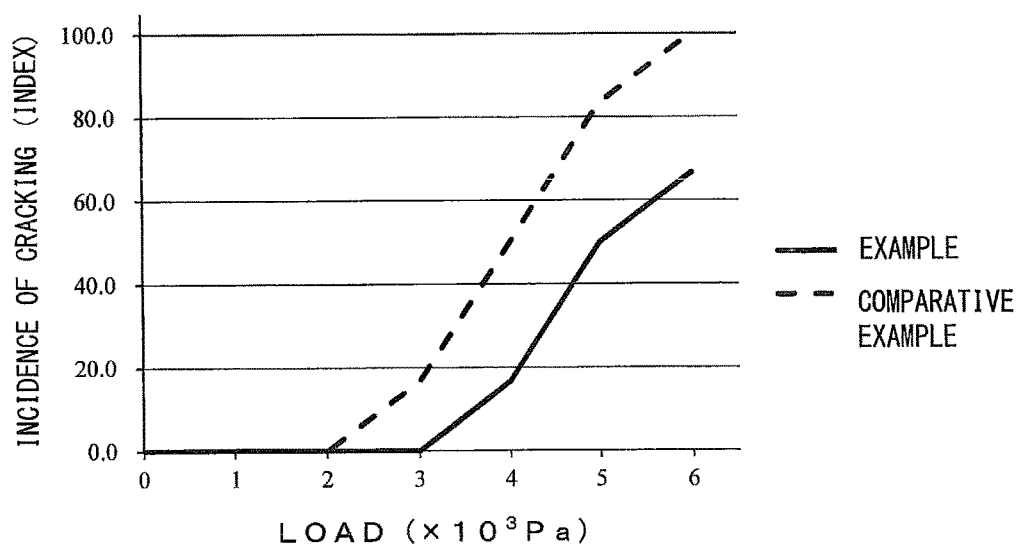
FIG. 12 is a graph illustrating the results of a load test and the incidence of cracking in solar cell modules including solar cells of an example and a comparative example.

FIG. 12 illustrates the results. FIG. 12 is a graph illustrating the relationship between the load and the incidence of cracking in each of the two types of the solar cell modules. The vertical axis of the graph is expressed in terms of an index when the incidence of cracking occurred in applying a load of 6000 Pa to the solar cell module including the solar cells of the comparative example is defined as 100.

The results demonstrated that the solar cell module including the solar cells of the example had a low incidence of cracking and a significantly improved load-carrying capacity, compared with the solar cell module including the solar cells of the comparative example.

REFERENCE SIGNS LIST 1, 1m solar cell
2 semiconductor substrate 2a light-receiving surface
2b non-light-receiving surface
2p first semiconductor portion
2n second semiconductor portion
3 connection electrode
4 collector electrode
5 auxiliary collector electrode
6 passivation film
7 busbar electrode
7a island portion
7b linear portion
8 transverse finger electrode
9 auxiliary busbar electrode
10 longitudinal finger electrode
11 end-portion electrode (pad)
12 gap portion
13 antireflection film
14 BSF layer
20a first conductive paste
20b second conductive paste
20c third conductive paste
21 solar cell module
21a first surface of solar cell module
21b second surface of solar cell module
22 conductive lead
23 solar cell panel
24 frame
25 terminal box
31 transparent substrate
32 front-side filling material
33 back-side filling material
34 back-side material
35 transverse lead
36 extraction lead
41 insulating pad (pad)
Y direction first direction
X direction second direction

The invention claimed is:

1. A solar cell comprising:
   a semiconductor substrate comprising:
      a first main surface, and
      a second main surface being as a backside of the first main surface;
   a busbar electrode lying on a line that is located on the second main surface, the line extending in a first direction between two portions in the vicinities of both end portions of the second main surface in the first direction; and
   a pad disposed on an extension of the busbar electrode and separated from the busbar electrode in one of the two portions in the vicinities of the end portions of the second main surface in the first direction, and having a thickness larger than that of the busbar electrode.

2. The solar cell according to claim 1, wherein the pad is composed of a conductive material.

3. The solar cell according to claim 2, wherein the pad is composed of a material having lower wettability with solder than the busbar electrode.

4. The solar cell according to claim 2,
   wherein the busbar electrode mainly contains silver, and the pad mainly contains aluminum.

5. The solar cell according to claim 1, wherein a length of the pad in a second direction orthogonal to the first direction is greater than another length of the busbar electrode in the second direction.

6. The solar cell according to claim 5, further comprising a plurality of finger electrodes having a strip shape, and extending from the busbar electrode in the second direction on the second main surface,
   wherein the finger electrodes are composed of the same material as the pad.

7. The solar cell according to claim 6, further comprising a second finger electrode extending from the pad in the second direction on the second main surface.

8. The solar cell according to claim 6,
   wherein the busbar electrode comprises:
   a linear portion extending in the first direction, and
   a plurality of protruding portions from the linear portion in the second direction,
   wherein the busbar electrode further comprises an auxiliary busbar electrode having a strip shape, and extending in the first direction along the busbar electrode on the second main surface,
   wherein the auxiliary busbar electrode is composed of the same material as the finger electrode, and
   wherein the auxiliary busbar electrode is connected to each of the finger electrodes and each of the protruding portions.

9. The solar cell according to claim 8, wherein the auxiliary busbar electrode is thicker than the finger electrode.

10. The solar cell according to claim 1, wherein the pad has a semicircle-like shape or a trapezoid-like shape.

11. The solar cell according to claim 1, wherein the pad comprises a slit-like portion or a grid-like portion.

12. A solar cell module comprising:
    a plurality of the solar cells according to claim 1,
    wherein the plurality of the solar cells are arranged, and adjacent solar cells are electrically connected together through a strip conductive lead in contact with the pad.

* * * * *